United States Patent [19]
Yu et al.

[11] Patent Number: 6,027,997
[45] Date of Patent: Feb. 22, 2000

[54] METHOD FOR CHEMICAL MECHANICAL POLISHING A SEMICONDUCTOR DEVICE USING SLURRY

[75] Inventors: Chris C. Yu; Jeffrey F. Hanson; Jeffrey L. Klein, all of Austin, Tex.

[73] Assignee: Motorola, Inc., Schaumburg, Ill.

[21] Appl. No.: 08/205,423

[22] Filed: Mar. 4, 1994

[51] Int. Cl.[7] .............................. B44C 1/22; H01L 21/306
[52] U.S. Cl. ..................... 438/633; 438/692; 156/633; 156/636
[58] Field of Search ..................... 156/636, 647

[56] References Cited

U.S. PATENT DOCUMENTS

| | | | |
|---|---|---|---|
| 3,385,682 | 5/1968 | Lowen | 156/636 |
| 4,475,981 | 10/1984 | Red | 156/636 |
| 4,491,500 | 1/1985 | Michaud et al. | 156/645 |
| 4,944,836 | 7/1990 | Beyer et al. | 156/645 |
| 4,956,313 | 9/1990 | Cote et al. | 437/203 |
| 4,959,113 | 9/1990 | Roberts | 156/636 |
| 4,992,135 | 2/1991 | Doan | 156/636 |
| 5,222,329 | 6/1993 | Yu | 51/165.77 |
| 5,244,534 | 9/1993 | Yu et al. | 156/636 |
| 5,340,370 | 8/1994 | Codien et al. | 156/636 |

*Primary Examiner*—John F. Niebling
*Assistant Examiner*—Ha Tran Nguyen
*Attorney, Agent, or Firm*—Patricia S. Goddard

[57] ABSTRACT

Conductive plugs (28) are formed in a semiconductor device (10) using a chemical mechanical polishing (CMP) process. A blanket conductive layer (26), for example of tungsten, is deposited in a plug opening (24). The conductive layer is polished back by CMP using a slurry comprised of either copper sulfate ($CuSO_4$) or copper perchlorate [$Cu(ClO_4)_2$] and an abrasive, such as alumina or silica, and water. In another embodiment, a CMP process using such slurries may be used to form conductive interconnects (50) in a semiconductor device (40).

14 Claims, 2 Drawing Sheets

METHOD FOR CHEMICAL MECHANICAL POLISHING A SEMICONDUCTOR DEVICE USING SLURRY

FIELD OF THE INVENTION

The present invention generally relates to methods for fabricating semiconductor devices, such as integrated circuits, and more particularly to using chemical mechanical polishing in semiconductor device fabrication.

BACKGROUND OF THE INVENTION

An increasing need to form planar surfaces in semiconductor device fabrication has led to the development of process technology known as chemical-mechanical-polishing (CMP). In CMP processes, semiconductor substrates are rotated against a polishing pad in the presence of an abrasive slurry. Most commonly, the layers to be planarized in semiconductor devices are electrically insulating layers overlying active circuit devices, such as $SiO_2$, PSG (phosphorus silicate glass) or BPSG (boron-doped PSG), and metal interconnect layers or metal vias, such as those made from aluminum, copper, or tungsten. As the substrate is rotated against the polishing pad, the abrasive force polishes the surface of the exposed insulating or metal layers. Additionally, chemical compounds within the slurry undergo a chemical reaction with the components of the exposed layers to enhance the rate of removal. By carefully selecting the chemical components of the slurry, the polishing process can be made more selective to one type of material than another. The ability to control the selectivity of a CMP process and the effectiveness of a CMP process in planarizing a given film has led to its increased use in the fabrication of complex integrated circuits.

CMP is especially of interest as a process to form conductive plugs or interconnects within semiconductor devices. Plugs are used to vertically connect various conductive members or regions within each device, including diffusion regions, gate electrodes, metal lines, and the like. In a typical plug formation process using CMP, an insulating layer is deposited over active circuitry of a device. The insulating layer is then lithographically patterned and etched to create substantially vertical-walled openings in the insulating layer which expose underlying conductive members or regions to be contacted. A blanket layer of metal is then deposited, thereby filling the openings and covering the entire device surface. CMP is used to polish back the metal layer and portions of the insulating layer so that the resulting device surface is planar, and so that the metal is removed from all portions of the device except within the openings of the insulating layer. These metal filled openings are referred to as plugs.

Tungsten is an attractive metal for use in creating conductive plugs. Unlike aluminum, tungsten can be chemically vapor deposited (CVD) onto a substrate so that vertical-wall openings within an insulating layer will be completely filled. Aluminum is typically sputter deposited. Sputter deposition is unable to completely fill steep, vertical-wall openings, resulting in what is sometimes referred to as voids. The advantage of having the openings in the insulating layer completely filled, resulting in reliable conductive plugs, outweighs the fact that tungsten metal is more resistive than aluminum.

To form tungsten plugs, many semiconductor manufacturers employ reactive ion etch (RIE) techniques. After a blanket layer of tungsten is deposited, filling any opening in an underlying insulating layer, the layer is etched using RIE. RIE techniques are well developed in etching tungsten, but these techniques have several drawbacks. One problem is the degree of overetch required to remove barrier and adhesions layers (such as titanium and titanium nitride) which are often present under a tungsten layer in a semiconductor device resulting in a recessed tungsten plug within the opening. In other words, to clear titanium and titanium nitride from the surface of the insulating layer, the tungsten within the plug opening becomes recessed such that the plugs are not planar with the adjacent insulating layer. An additional problem associated with RIE is that the etches tend to open seams in the metal within each plug opening. In depositing metal into openings in an insulating layer using CVD metal deposition, metal deposits from the sidewalls of the opening inward, resulting in a seam in the metal located near the center of the opening. Upon etching this metal using RIE, the etch attacks the seam area, creating possible reliability problems in the resulting metal plugs. A further disadvantage to the use of RIE in conjunction with forming tungsten plugs is a high particulate level which leads to defects in the semiconductor devices.

For the reasons provided above, it is apparent that CMP would be an attractive alternative to current processes for forming tungsten plugs which use RIE. However, existing CMP techniques for polishing tungsten also have significant drawbacks. For instance, slurries which have been used to polish tungsten typically have very low pHs. The high acidity of these slurries attacks and stains the CMP equipment, particularly tubs, and creates material handling concerns. Furthermore, CMP techniques used to polish tungsten often have very slow polishing rates which are not suitable for a manufacturing environment. Accordingly, a need for an improved CMP technique, and particularly one which etches tungsten, would be beneficial.

SUMMARY OF THE INVENTION

In one form of the invention, a method for polishing a semiconductor device involves polishing the device using a slurry comprising either copper sulfate or copper perchlorate.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF A PREFERRED EMBODIMENT

Figure 1:
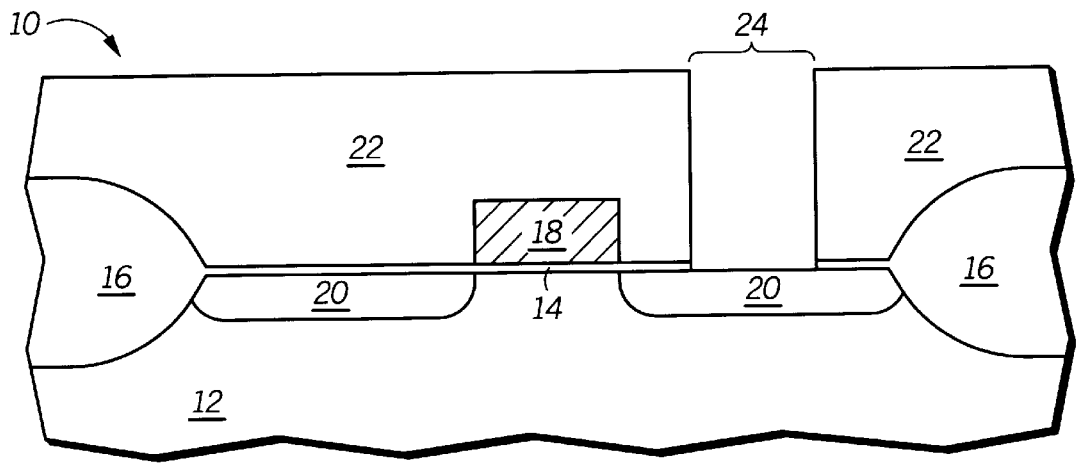
FIGS. 1–3 illustrate in cross-section a method for fabricating a semiconductor device having a conductive plug using CMP in accordance with the present invention.

The present invention concerns use of a slurry in a CMP process which facilitates semiconductor device polishing, and particularly facilitates polishing of tungsten. The slurry includes an oxidizing agent of either copper sulfate ($CuSO_4$) or copper perchlorate [$Cu(ClO_4)_2$]. An abrasive, such as alumina or silica, and water are also part of the slurry. With the present invention, polishing rates of between 1000–1650Å per minute were demonstrated, while the pH of the slurry was measured at between 4–6. Accordingly, the present invention provides a method of CMP which is suitable for use in a manufacturing environment while at the same time alleviates those problems associated with highly acidic slurries used in the prior art.

In accordance with the present invention, an oxidizing agent of either copper sulfate or copper perchlorate is mixed with an abrasive and water. In using copper sulfate, about 30–100 grams of solid (powder) copper sulfate ($CuSO_4$) are mixed in a solution of one liter of deionized water to which has been added 1–30 grams of an abrasive, such as alumina having a particle size comparable to the sizes already in used in semiconductor CMP applications. (Thus, the relative constituents are 30–100 grams per liter $CuSO_4$ and 1–30 grams per liter alumina). The mixing is accomplished at room temperature. In formulating one sample, the abrasives were first added to the deionized water, followed by the addition of the $CuSO_4$. However, the present invention is not limited by a particular order of mixing the constituents. Upon mixing, the copper sulfate at least partially dissolves in the solution, resulting in a blue-colored slurry. The slurry is preferably mechanically or physically agitated prior to dispensing to achieve a uniform distribution within the slurry. Over time, the abrasives may settle out, although various non-reactive suspension agents may also be added to the slurry to prevent such settling.

In using copper perchlorate, about 10–40 grams of solid (powder) copper perchlorate hexahydrate [$Cu(ClO_4)_2 6H_2O$] are added to a solution of one liter of deionized water and about 1–30 grams of alumina or other abrasive. Mixing is again accomplished at room temperature, and results in an bluish slurry. Again in preparation, the abrasive and water were first combined prior to the addition of the oxidizing agent, although another order of mixing may also work. Mechanical agitation is also used to provide uniform distribution prior to dispensing. It is noted that while the oxidizing agent used as herein described was copper perchlorate hexahydrate, any form of copper perchlorate (hydrated or not) should likewise work as a polishing slurry constituent.

Upon mixing a slurry formulated in accordance with the present invention, the slurry is used in a CMP process similar to those techniques known in the prior art. A semiconductor device, usually in the form of a wafer, is mounted to a wafer holder located above a rotating polishing pad. A slurry in accordance with the present invention is flowed onto the polishing pad at anywhere between 50–200 mL per minute. The wafer is then brought in contact with the polishing pad, which is rotating at between approximately 20–60 rpm (rotations per minute). The pressure of the wafer against the polishing pad is typically maintained at between 4–10 pounds per square inch (psi).

Below is a table of two sample slurries made in accordance with the present invention, along with some data regarding performance and physical properties of the slurry for etching a tungsten layer.

| Slurry Type | Formulation | pH | Pressure (psi) | Polish Rate (Å/min.) |
|---|---|---|---|---|
| Copper Sulfate | 1) 32 g/L $CuSO_4$<br>2) 7 g/L $Al_2O_3$<br>3) DI $H_2O$ | 4 | 10 | 1010 |
| Copper Perchlorate | 1) 17 g/L $Cu(ClO_4)_2 6H_2O$<br>2) 30 g/L $Al_2O_3$<br>3) DI $H_2O$ | 6 | 4 | 1330 |
|  |  |  | 8 | 1650 |

It should be noted that the above-listed polishing rates can be further improved by optimizing the polishing process. For example, a higher polishing rate can be achieved using a higher chemical concentration, or perhaps by using a higher polishing pad temperature. In the above examples, the polishing pad temperature was 135° F. Furthermore, pH values other than those specifically listed may be achieved. Generally, pH values of approximately 4–7 may be expected.

The proposed reaction for using a copper sulfate slurry to polish tungsten is as follows (although it is to be understood that this reaction is theoretical and predicted, and that the present invention is not limited to this specific reaction):

$$CuSO_4 + W \rightarrow Cu + _xWSO_4 -.$$

In addition, tungsten oxide or tungsten chloride reaction products may result.

The proposed reaction for using a copper perchlorate slurry to polish tungsten is as follows (although it is to be understood that this reaction is theoretical and predicted, and that the present invention is not limited to this specific reaction):

$$Cu(ClO_4)_2 6H_2O + W \rightarrow Cu + _xW(ClO_4)_2 + _x 6H_2O.$$

Again, tungsten oxide may result from the reaction as well.

Figure 2:
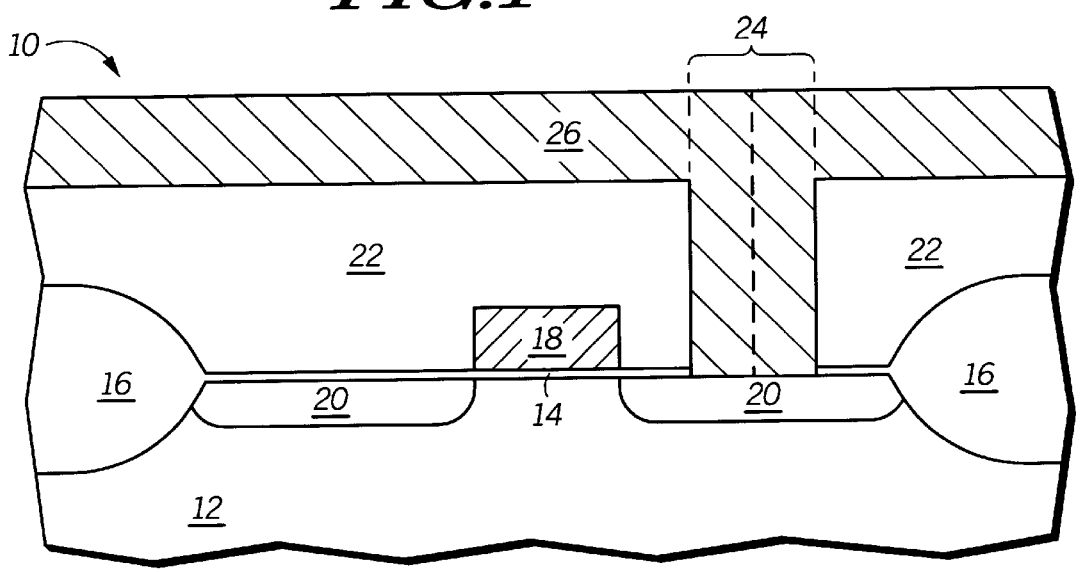
Figure 3:
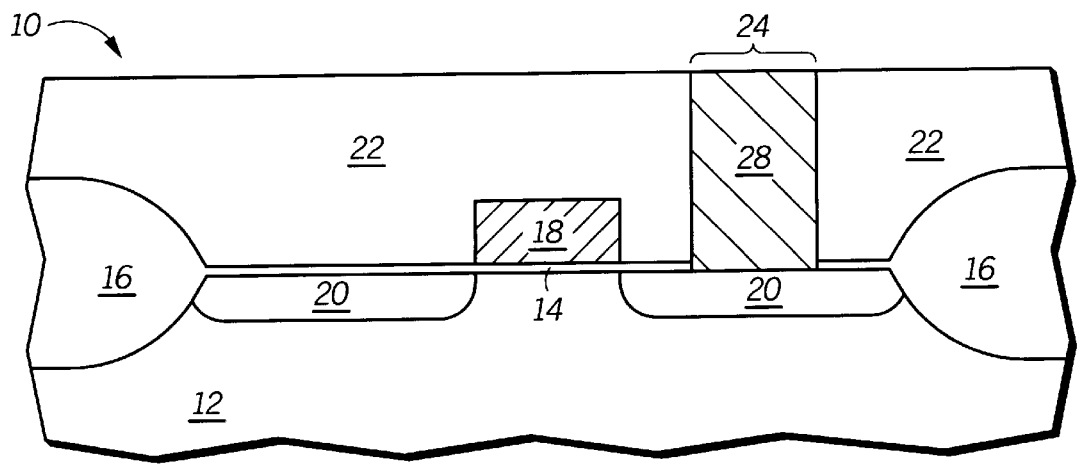
Figure 4:
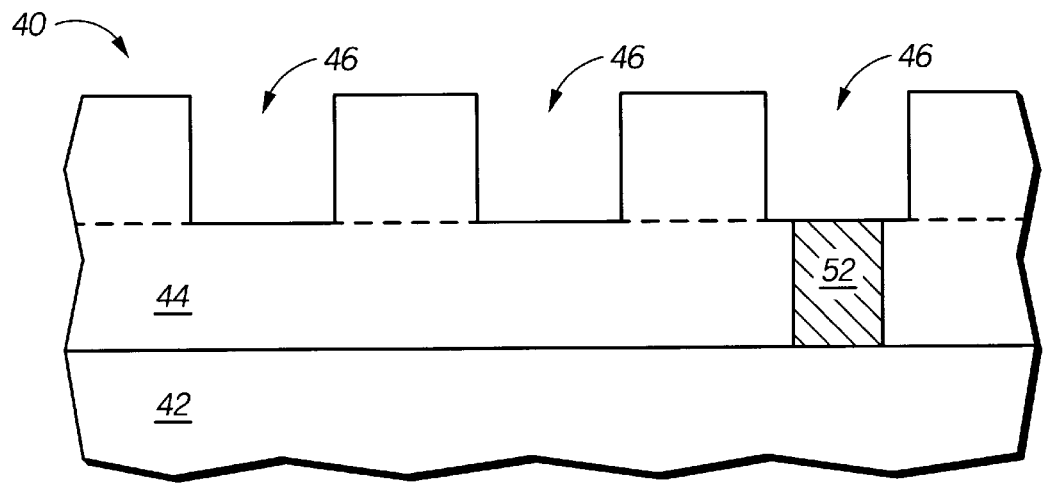
FIGS. 4–6 also illustrate in cross-section a method for fabricating a semiconductor device having conductive interconnects using CMP in accordance with the present invention.
Figure 5:
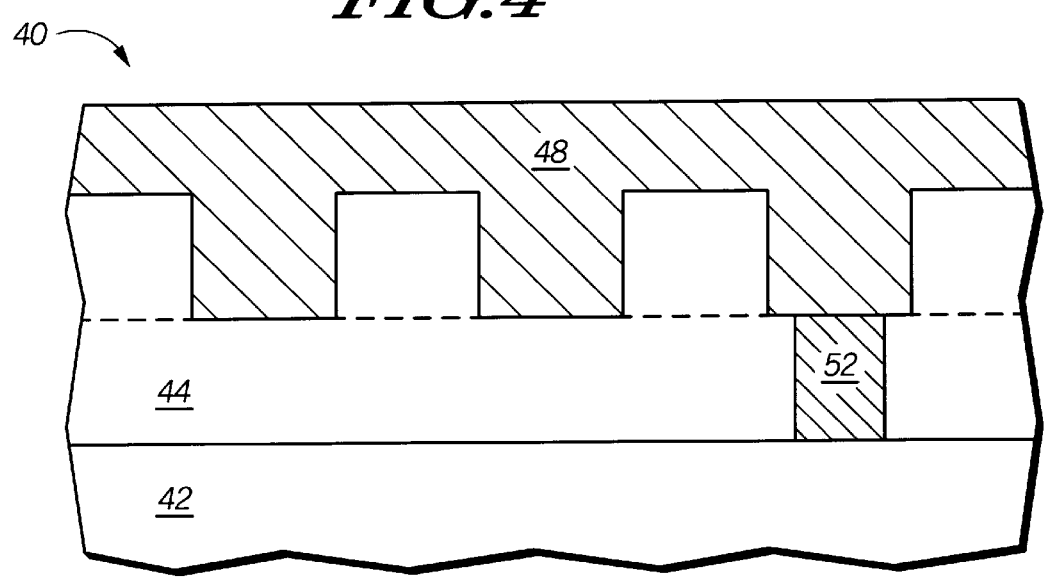
Figure 6:
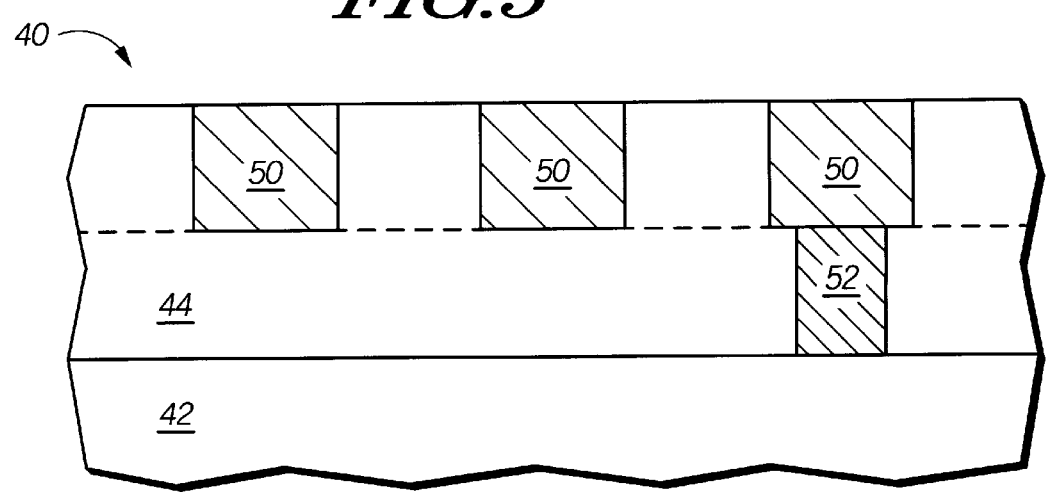

The present invention is particularly useful for the formation of conductive plugs and/or interconnects in semiconductor devices, although the invention may be suitable for other polishing applications as well. FIGS. 1–6 illustrate how the present invention may be used in accordance with two embodiments of the invention. FIGS. 1–3 are cross-sectional views of a portion of a semiconductor 10 wherein the present invention is used to form a conductive plug, while FIGS. 4–6 are cross-sectional views of a portion of a semiconductor device 40 wherein the present invention is used for form interconnects.

Device 10 of FIG. 1 includes a semiconductor substrate 12 which is typically a semiconducting wafer made of silicon, gallium-arsenide, or the like. A gate dielectric 14 is formed on a surface of the substrate. Field isolation regions 16 are created to isolate adjacent active regions of the substrate. Overlying the active substrate region and separating the field isolation regions is a gate electrode 18 of a conventional metal-oxide semiconductor (MOS) transistor. Aligned to sidewalls of gate electrode 18 and formed within substrate 12 are doped regions 20 which form source and drain electrodes of the transistor. As thus far described, all elements of device 10 are formed using any of numerous techniques known within the semiconductor industry. The precise methods, materials, and resulting structural appearance of these elements may vary widely and are therefore not addressed here in detail. Furthermore, such detail is not necessary in understanding the operability and applications of the present invention.

In accordance with one embodiment of the present invention, a conductive plug is formed to contact one of doped regions 20. It should be understood, however, that conductive plugs formed in accordance with the invention need not be formed to a source or drain electrode of a transistor. It is within the scope of the invention for a plug to be formed to any conductive region or member (including, but not limited to, the substrate, doped regions, polysilicon layers, silicide layers, and metal layers) of a semiconductor device. To form a conductive plug or contact to one of doped regions 20, a dielectric layer 22 is deposited over device 10. Dielectric layer 22 may be any of several dielectric materials used in semiconductor devices, including $SiO_2$, PSG (phospho-silicate glass), BPSG (boron-doped PSG), TEOS (tetra-ethyl-ortho-silicate), $Si_3N_4$, or the like. An opening 24 is formed within dielectric layer 22 using conventional lithography and etching techniques to expose the underlying conductive region to be contacted. In this case, doped region 20 is the region to be contacted. To expose doped region 20, dielectric layer 14 must also be removed from within opening 24 if it is present within opening 24. Removal of dielectric layer 14 within opening 24 may be accomplished using the same etch chemistry as that to remove dielectric 22 if the materials are similar. Alternatively, a different etch process may be required although no additional masking is needed.

After exposing the conductive region to be contacted (doped region 20), a conductive layer 26 is deposited in blanket form over device 10, as illustrated in FIG. 2. While in preferred embodiments of the present invention, conductive layer 26 is a layer of tungsten, other materials (particularly metals) are also suitable. If tungsten is used, the layer is preferably deposited using chemical vapor deposition (CVD) to completely fill opening 24. CVD tungsten may be deposited by a conventional hydrogen reduction process, wherein tungsten hexafluoride ($WF_6$) is reduced by hydrogen ($H_2$) according to the equation:

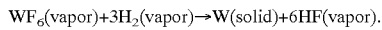

$WF_6$(vapor)+$3H_2$(vapor)→W(solid)+6HF(vapor).

The reaction is typically carried out between 250–500° C. This process is merely illustrative, as any known tungsten deposition process is suitable for use with the present invention. It should also be noted that while the dielectric layer 22 and conductive layer 26 in FIG. 2 are illustrated as being relatively planar, the present invention may also be practiced using irregular or non-planar device topographies.

After depositing conductive layer 26, the layer is polished by CMP using a slurry as described above. As discussed above, general parameters for polishing conductive layer 26 are as follows: pressure of 4–10 psi; polishing platen speed of 20–60 rpm, platen or pad temperature of 80–150° F., and slurry flow rate of 50–200 mL per minute. Conductive layer 26 is polished (and perhaps uppermost portions of dielectric layer 22 may also be polished) until only that portion of conductive layer 26 within opening 24 remains, thus resulting in a conductive plug 28 as illustrated in FIG. 3. Any of the known end-point detection mechanisms available may be used to help determine when to cease the polishing process. Once conductive plug 28 is formed, remaining device fabrication steps (e.g. those to form metal layers, interlayer dielectric layers, and passivation) are performed as known in the art for the particular type of device being manufactured.

FIGS. 4–6 illustrate another application for the present invention, namely that of forming conductive interconnects. Illustrated in cross-section in each of the figures is a portion of a semiconductor device 40. Device 40 includes a layer 42 having an overlying dielectric layer 44. Layer 42 may be any layer of a semiconductor device, including, but not limited to, a semiconductor substrate, another dielectric layer, a polysilicon layer, a silicide layer, or a metal layer. Device 40 also includes active circuitry (e.g. transistors, resistors, capacitors, or the like) in portions of the device not illustrated; although for purposes of understanding this embodiment of the present invention further discussion of the circuitry is not necessary. Dielectric layer 44 may be of any material used as dielectrics in semiconductor processing, such as $SiO_2$, PSG, BPSG, TEOS, or the like.

Using conventional lithography and etching methods, dielectric layer 44 is patterned to create a plurality of trenches 46 therein. The geometry and locations of trenches 46 is determined by desired geometry and location of the interconnects to be formed. After forming trenches 46, a conductive layer 48 is deposited on device 40, as illustrated in FIG. 5. Conductive layer 48 is generally a metal, and preferably tungsten, although the present invention may also be practiced using other conductive materials. Conventional processes for depositing conductive layer 48, such as the processes described above in reference to conductive layer 26, are all suitable. In accordance with the present invention, conductive layer 48 is polished back using the CMP method described above to form a plurality of interconnects 50 within the trenches of the dielectric layer, as illustrated in FIG. 6. Although some interconnects 50 are not illustrated as being electrically coupled to underlying layer 42, such may be the case. A conductive plug as described above may also be formed in dielectric layer 44 beneath one of the interconnects to electrically connect the interconnect to layer 42 if layer 42 is conductive or semiconductive. Such an embodiment is demonstrated by the addition of a conductive plug 52 as illustrated in FIGS. 4–6. To form plug 52, two separate dielectric layers may be necessary in place of the one dielectric layer 44 illustrated. For instance, one patterned dielectric layer to aid in forming the conductive plug, and another patterned dielectric layer to aid in forming the interconnects. This is demonstrated by the hidden lines shown in FIGS. 4–6. As an alternative to the interconnect embodiment illustrated, trenches 46 in dielectric layer 44 may be etched to extend down to the interface between dielectric layer 44 and layer 42 so that electrical contact may be made directly between portions of interconnects 50 and layer 42.

Advantages of the present invention over existing methods to form conductive plugs and interconnects include the following. In general CMP techniques are preferred to RIE techniques because RIE tends to open seams in conformally deposited conductive layers. For example, in FIG. 2, conductive layer 26 is deposited within opening 24 from the sidewalls of the opening inward, resulting in a seam (shown as a vertical dashed line). The seam region is opened or enlarged using RIE, but when using CMP the seam is protected because CMP tends to polish high points on the device or wafer at a faster rate and low points at a lower rate. Another advantage in using CMP over RIE is a reduced particle level and defectivity level in the process. Furthermore, the need to over-etch in an RIE process to insure adequate removal of barrier and adhesion layers (such as titanium and titanium nitride) often results in recessed plugs. This problem is avoided in a CMP process because when the metal and dielectric layer interface is reached, the metal removal rate within the plug opening is reduced significantly. With respect to existing CMP processes for polishing tungsten, the present invention has the advantage of using a more neutral slurry as compared to the acidic slurries which have been demonstrated. Neutral pH levels are preferable to avoid chemical attack on the CMP equipment and to lessen potential handling dangers. In addition, the present invention achieves polishing rates which are more conducive to a manufacturing environment than those previously demonstrated.

Thus it is apparent that there has been provided, in accordance with the invention, a method for chemical mechanical polishing a semiconductor device that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the present invention is not limited to applications for forming conductive plugs and interconnects. Any application involving polishing of semiconductor devices is within the scope of the invention. In addition, the invention is not limited to polishing tungsten layers. The invention may be suitable for polishing other layers not specifically described. Furthermore, any abrasive used in the slurry is not limited to alumina. Other abrasives, such as silica, are also suitable. In addition, the slurry composition may include elements or agents other than those specifically listed. For example, in refining the slurry composition agents which enhance suspension, viscosity, shelf-life, and the properties of the slurry may also be included. In addition, the polishing rate of adhesion layers (or barrier layers) such as titanium and titanium nitride, which are typically deposited before the deposition of tungsten, may be lower than that of tungsten or other metal. The increased abrasive concentration, or addition of an additional chemical in the slurry may enhance the polishing rate of such adhesion (or barrier) layers. Therefore, it is intended that this invention encompass all such variations and modifications as fall within the scope of the appended claims.

we claim:

1. A method for chemical mechanical polishing a metal layer in a semiconductor device comprising the step of polishing the metal layer using a slurry comprising copper sulfate and having a pH of between approximately 4–7.

2. The method of claim 1 wherein the metal layer is a layer of tungsten, and wherein the step of polishing comprises polishing the layer of tungsten.

3. The method of claim 2 wherein the metal layer is formed over a dielectric layer of the semiconductor device, and wherein the step of polishing comprises polishing the metal layer without significantly removing the dielectric layer.

4. A method for chemical mechanical polishing a metal layer in a semiconductor device comprising the step of polishing the metal layer using a slurry comprising copper perchlorate and having a pH of between approximately 4–7.

5. The method of claim 4 wherein the metal layer is a layer of tungsten, and wherein the step of polishing comprises polishing the layer of tungsten.

6. The method of claim 5 wherein the metal layer is formed over a dielectric layer of the semiconductor device, and wherein the step of polishing comprises polishing the metal layer without significantly removing the dielectric layer.

7. A method for chemical mechanical polishing a semiconductor device comprising the steps of:

providing a semiconductor substrate;

forming an insulating layer overlying the semiconductor substrate, the insulating layer having a recess therein;

depositing a tungsten layer over the insulating layer and within the recess; and polishing the tungsten layer using a slurry comprising a chemical selected from a group consisting of copper sulfate and copper perchlorate.

8. The method of claim 7 wherein the step of polishing comprises polishing the tungsten to form a tungsten to form a tungsten plug within the recess in the insulating layer.

9. The method of claim 7 wherein the step of polishing comprises polishing the tungsten to form a tungsten interconnect within the recess in the insulating layer.

10. A method for chemical mechanical polishing a semiconductor device comprising the steps of:

providing a semiconductor substrate having active circuitry with a plurality of conductive regions;

forming an insulating layer over the active circuitry and patterned to have a plurality of openings in the insulating layer, each opening exposing a conductive region of the plurality of conductive regions;

depositing a metal layer over the insulating layer and within each of the plurality of openings;

providing a slurry comprised of one of either copper perchlorate or copper sulfate; and chemical mechanical polishing the metal layer using the slurry to form a conductive plug within each opening.

11. The method of claim 10 wherein the step of providing a slurry comprises providing a slurry further comprised of alumina.

12. The method of claim 10 wherein the step of providing a slurry comprises providing a slurry having a pH between approximately 4–7.

13. The method of claim 10 wherein the step of depositing a metal layer comprises depositing tungsten.

14. The method of claim 13 wherein the step of providing a slurry comprises providing a slurry having a pH between approximately 4–7.

* * * * *